United States Patent
Pipitone et al.

(10) Patent No.: US 7,750,644 B2
(45) Date of Patent: *Jul. 6, 2010

(54) SYSTEM WITH MULTI-LOCATION ARC THRESHOLD COMPARATORS AND COMMUNICATION CHANNELS FOR CARRYING ARC DETECTION FLAGS AND THRESHOLD UPDATING

(75) Inventors: John Pipitone, Livermore, CA (US); Ryan Nunn-Gage, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 196 days.

This patent is subject to a terminal disclaimer.

(21) Appl. No.: 11/893,352

(22) Filed: Aug. 15, 2007

(65) Prior Publication Data

US 2009/0044748 A1    Feb. 19, 2009

(51) Int. Cl.
*H01H 9/50* (2006.01)
*C23C 14/34* (2006.01)
(52) U.S. Cl. .................. 324/536; 438/10; 204/298.03; 204/298.08
(58) Field of Classification Search ............. 324/536; 438/10
See application file for complete search history.

(56) References Cited

U.S. PATENT DOCUMENTS

| | | | |
|---|---|---|---|
| 4,156,472 A | 5/1979 | Kunz | 177/25.13 |
| 4,737,970 A | 4/1988 | Viola et al. | 375/354 |
| 5,472,561 A * | 12/1995 | Williams et al. | 438/10 |
| 5,847,913 A * | 12/1998 | Turner et al. | 361/93.1 |
| 5,993,615 A * | 11/1999 | Abry et al. | 204/192.13 |
| 6,190,513 B1 | 2/2001 | Forster et al. | 204/192.12 |
| 6,246,567 B1 * | 6/2001 | Parkhe | 361/234 |
| 6,462,481 B1 * | 10/2002 | Holland et al. | 315/111.21 |
| 6,736,944 B2 | 5/2004 | Buda | 204/192.13 |
| 6,840,763 B2 | 1/2005 | Sik | 432/77 |
| 7,475,294 B2 | 1/2009 | Maki et al. | 714/48 |
| 7,553,679 B2 * | 6/2009 | Hoffman | 438/14 |
| 2002/0125892 A1 * | 9/2002 | Parker et al. | 324/536 |
| 2003/0082835 A1 * | 5/2003 | McChesney et al. | 438/10 |
| 2004/0182697 A1 | 9/2004 | Buda | 204/298.08 |
| 2005/0236266 A1 * | 10/2005 | Poole et al. | 204/192.13 |
| 2005/0236377 A1 | 10/2005 | Hoffman et al. | 219/121.43 |

(Continued)

FOREIGN PATENT DOCUMENTS

JP    2006/237009 A    9/2006

OTHER PUBLICATIONS

U.S. Appl. No. 11/893,353, filed Aug. 15, 2007, Pipitone et al.

(Continued)

*Primary Examiner*—Timothy J Dole
*Assistant Examiner*—John Zhu
(74) *Attorney, Agent, or Firm*—Law Office of Robert M. Wallace

(57) ABSTRACT

A plasma reactor system for processing a wafer in which respective comparators are coupled to the respective RF transient sensors which are coupled in turn to respective RF power application points. The comparators have respective comparison thresholds. The system further includes a controller programmed to updating the respective thresholds of the comparators with respective updated thresholds for different ones of the steps of the process recipe.

14 Claims, 12 Drawing Sheets

U.S. PATENT DOCUMENTS

| | | | |
|---|---|---|---|
| 2006/0049831 A1* | 3/2006 | Anwar et al. | 324/536 |
| 2006/0081564 A1 | 4/2006 | Moroz et al. | 219/121.43 |
| 2006/0196421 A1* | 9/2006 | Ronsse et al. | 118/715 |
| 2006/0213761 A1 | 9/2006 | Axenbeck et al. | 204/192.1 |
| 2007/0019360 A1 | 1/2007 | Huang et al. | 361/234 |

OTHER PUBLICATIONS

U.S. Appl. No. 11/893,354, filed Aug. 15, 2007, Pipitone et al.

U.S. Appl. No. 11/893,355, filed Aug. 15, 2007, Pipitone et al.

U.S. Appl. No. 11/893,390, filed Aug. 15, 2007, Pipitone et al.

Official Communication Dated Sep. 8, 2009 in Co-Pending U.S. Appl. No. 11/893,390.

Official Communication Dated Sep. 23, 2009 in Co-Pending U.S. Appl. No. 11/893,354.

Official Communication Dated Sep. 23, 2009 in Co-Pending U.S. Appl. No. 11/893,355.

Official Communication Dated Sep. 24, 2009 in Co-Pending U.S. Appl. No. 11/893,353.

* cited by examiner

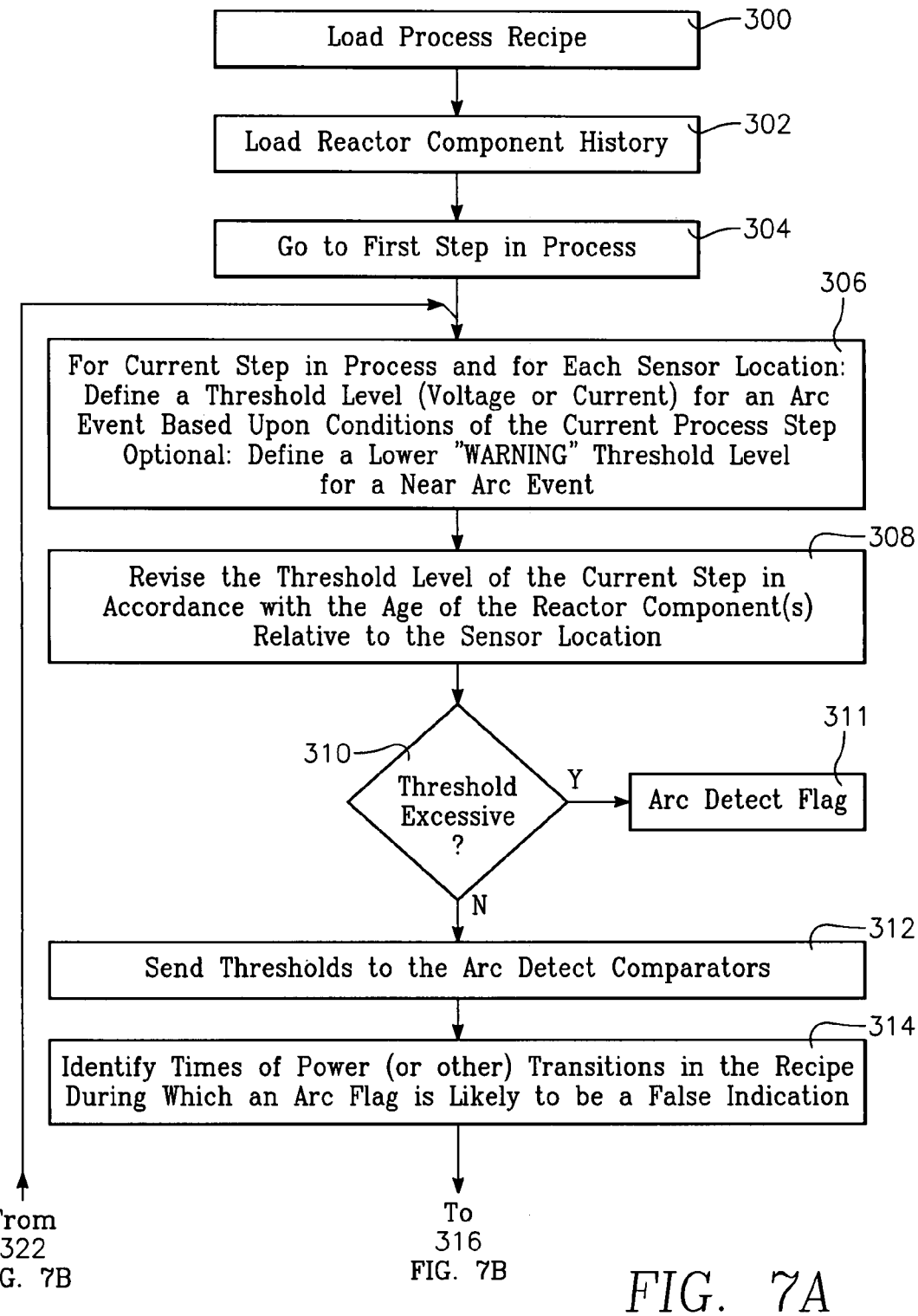

SYSTEM WITH MULTI-LOCATION ARC THRESHOLD COMPARATORS AND COMMUNICATION CHANNELS FOR CARRYING ARC DETECTION FLAGS AND THRESHOLD UPDATING

TECHNICAL FIELD

The disclosure concerns plasma reactors for processing semiconductor workpiece, and detection of arcing in such a reactor.

BACKGROUND

Arcing in a plasma reactor during processing of a semiconductor workpiece or wafer can destroy the workpiece or make unusable, or contaminate the reactor chamber. Therefore, detection of arcing to stop a plasma reactor from processing further wafers is essential to avoid damage to a succession of wafers. In physical vapor deposition (PVD) plasma reactors, arc detection has been confined to arcing at the sputter target at the reactor ceiling. Such arc detection has been made by monitoring the output of the high voltage D.C. power supply coupled to the sputter target at the ceiling. Voltage or current transients can reflect arcing events. While this approach has provided reliable indication of arcing events occurring at or near the sputter target at the reactor ceiling, it has not provided a reliable indication of arcing at the wafer (wafer level arcing). Detection of wafer level arcing can be particularly difficult because of RF noise surrounding the wafer caused by RF power applied to the wafer support pedestal and, in some reactors, to RF power applied to an inductive coil on the chamber side wall. Another challenge is the large dynamic range of transients or noise caused by RF generator transitions called for by a process recipe, for example. Such transition-induced transients must be distinguished from transients caused by arcing at the wafer level.

Plasma reactors typically have components within the reactor chamber that are consumed or degraded by their interaction with plasma. In a PVD reactor, the consumables may include the sputter target at the ceiling, an internal side wall coil and a process ring kit surrounding the wafer support pedestal including the electrostatic chuck (ESC). As such consumables degrade or are physically changed, they become more susceptible to arcing. The problem is how to determine when each consumable should be replaced before there is an arc.

SUMMARY

A plasma reactor system for processing a semiconductor wafer comprises a reactor chamber and a support pedestal in the chamber for holding a workpiece, and plural power applicators with respective power generators coupled to the power applicators. Respective voltage or current transient sensors are coupled to respective ones of the power applicators and to the support pedestal. Respective comparators are coupled to the respective transient sensors, the respective comparators associated with respective comparison thresholds. The system further includes a programmable controller programmed to carry out the steps of: (a) storing a process recipe comprising plural steps; (b) updating the respective thresholds of the respective comparators with respective updated thresholds for different ones of the steps of the process recipe; and (c) responding to an arc detection flag from one of the comparators by deactivating the respective power generators. In one embodiment, the system may further comprise communication channel apparatus coupled between the programmable controller and each of the comparators. In one embodiment, the controller is programmed to update the respective thresholds by transmitting the updated thresholds to the respective comparators through the communication channel apparatus.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIGS. 7A and 7B together constitute a flow diagram depicting the operation of a reactor controller in any of the foregoing embodiments.

To facilitate understanding, identical reference numerals have been used, where possible, to designate identical elements that are common to the figures. The drawings in the figures are all schematic and not to scale.

DETAILED DESCRIPTION

Figure 1A:
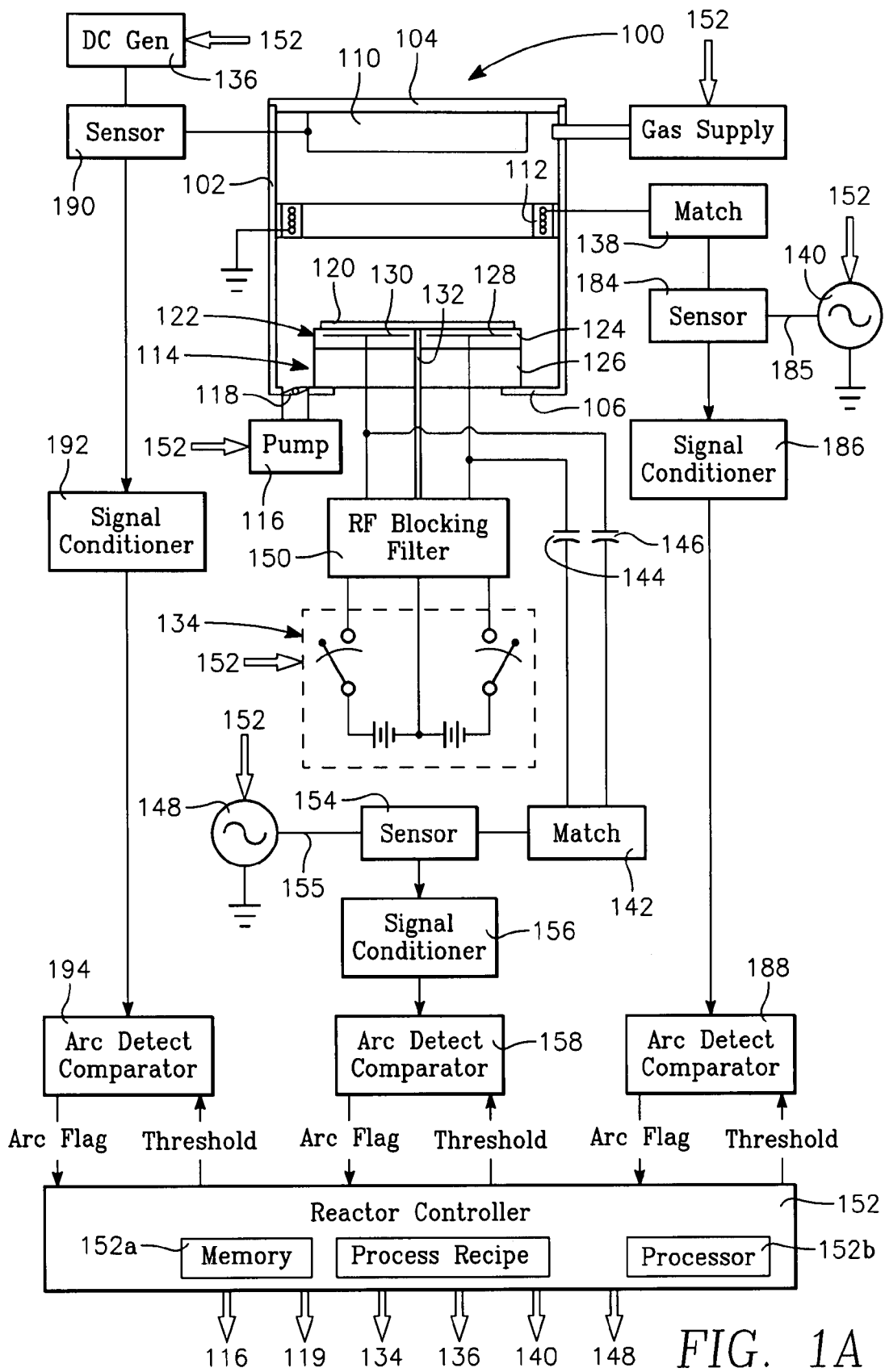
FIGS. 1A and 1B depict a plasma reactor with bipolar and monopolar electrostatic chucks, respectively, having certain wafer level arc detection and automatic shutdown features.

FIG. 1A depicts a PVD reactor having a system for intelligently sensing arcing at the wafer level. The reactor includes a chamber 100 defined by a cylindrical side wall 102, a ceiling 104 and a floor 106. Within the interior of the chamber 100 are provided a target 110 mounted on the ceiling 104, an RF coil 112 mounted on the side wall 102 and a wafer support pedestal 114 extending upwardly from the floor 106. A vacuum pump 116 evacuates the chamber 100 through a pumping port 118 in the floor 106. A process gas supply 119 provides process gas (or gases) for introduction into the chamber 100.

Figure 1B:
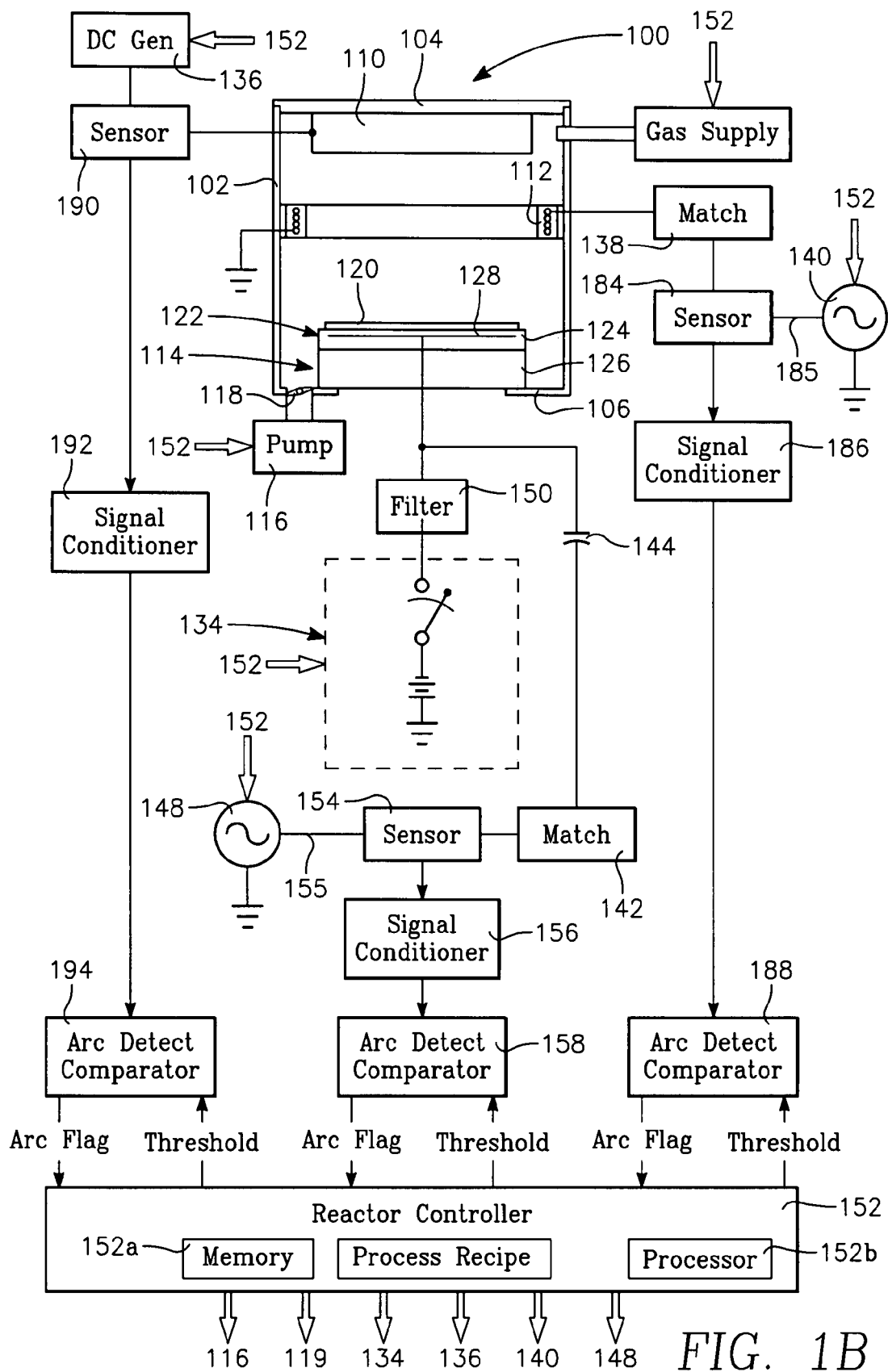

The wafer support pedestal 114, in one embodiment, may include an electrostatic chuck (ESC) 122 for holding a semiconductor wafer or workpiece 120 on a top surface of the pedestal 114. The ESC 122 may consist of an insulating layer 124 resting on a conductive base 126. In the embodiment of FIG. 1A, the ESC 122 is a bipolar chuck, and there are two electrodes 128, 130 in the insulating layer 124, and a conductive center pin 132 contacting the back side of the wafer 120. A chucking voltage supply 134 imposes opposite but equal D.C. voltages between the center pin 132 and the electrodes 128, 130. FIG. 1B depicts a variation of the embodiment of FIG. 1A in which the ESC 122 is a monopolar chuck and there is a single electrode 128 having a diameter corresponding, generally, to that of the workpiece or wafer 120. In the embodiment of FIG. 1B, the center pin 132 may not be present. Except for these differences, the embodiments of FIGS. 1A and 1B contain common structural features, and the description below of these common features with reference to FIG. 1A pertains to the embodiment of FIG. 1B as well, but are not repeated for the sake of brevity.

Referring again to FIG. 1A, D.C. power is applied to the sputter target 110 by a high voltage D.C. power generator 136. Low frequency RF power is applied to the coil 112 through an RF impedance match 138 by an RF power generator 140. The RF power generator 140 is connected to an RF input of the impedance match 138. In one embodiment, the RF impedance match 138 may have a low power D.C. input (not shown) in addition to the RF input. In the embodiment of FIG. 1A, RF bias power of a suitable frequency (such as low frequency and/or high frequency) is applied to the ESC electrodes 128, 130 through a bias impedance match 142 and blocking capacitors 144, 146 by an RF power generator 148. An RF blocking filter 150 connected between the ESC electrodes and center pin 128, 130, 132 and the DC chucking voltage supply 134 isolates the chucking voltage supply 134 from RF power. In the embodiment of FIG. 1B, RF bias power of a suitable frequency (such as low frequency and/or high frequency) is applied to the single ESC electrode 128 through the bias impedance match 142 and blocking capacitor 144 by the RF bias power generator 148.

Referring again to FIG. 1A, a reactor controller 152 governs operation of all the active elements of the reactor. Specifically, FIG. 1A indicates the communication of ON/OFF commands from the controller 152 to each of the power generators 136, 140, and 148, to the gas supply 119, to the vacuum pump 116 and to the ESC chucking voltage supply 134. Although not shown in the drawing of FIG. 1A, other active components of the reactor are likewise governed by the controller 152, including coolant pumps, lid interlocks, lift pin actuators, pedestal elevation actuators, slit valve opening, wafer handling robotics, for example.

Wafer Level Arc Detection:

Detecting plasma arcing at the wafer is difficult because of the presence of RF noise and harmonics and because of the large dynamic range of voltage or current transients at the wafer caused by non-arcing events (power generator transitions) and by arcing. These problems are overcome by sensing current or voltage changes at the RF bias power input to the ESC 122. An RF sensor 154 is placed at (or connected to) an RF conductor 155 (e.g., the inner conductor of a 50 Ohm coaxial cable) running between the RF bias generator 148 and the RF bias impedance match 142. In one embodiment, the RF sensor 154 is contained inside the impedance match 142 and is located at an internal coaxial output connector (not shown) to which the coaxial cable 155 is connected. The RF sensor 154 is capable of sensing an RF current or an RF voltage and generating a voltage signal proportional to the sensed current (or sensed voltage). The voltage signal is processed by a signal conditioner 156 to produce an output signal that has been filtered and peak-detected and scaled to a predetermined range. An arc detect comparator 158 compares the magnitude of the output signal to a predetermined threshold value. If this threshold is exceeded by the output signal, the arc detect comparator outputs an arc flag to the reactor controller 152. The reactor controller 152 responds to the arc flag by shutting down active components of reactor such as the power generators 136, 140 and 148.

Figure 2:
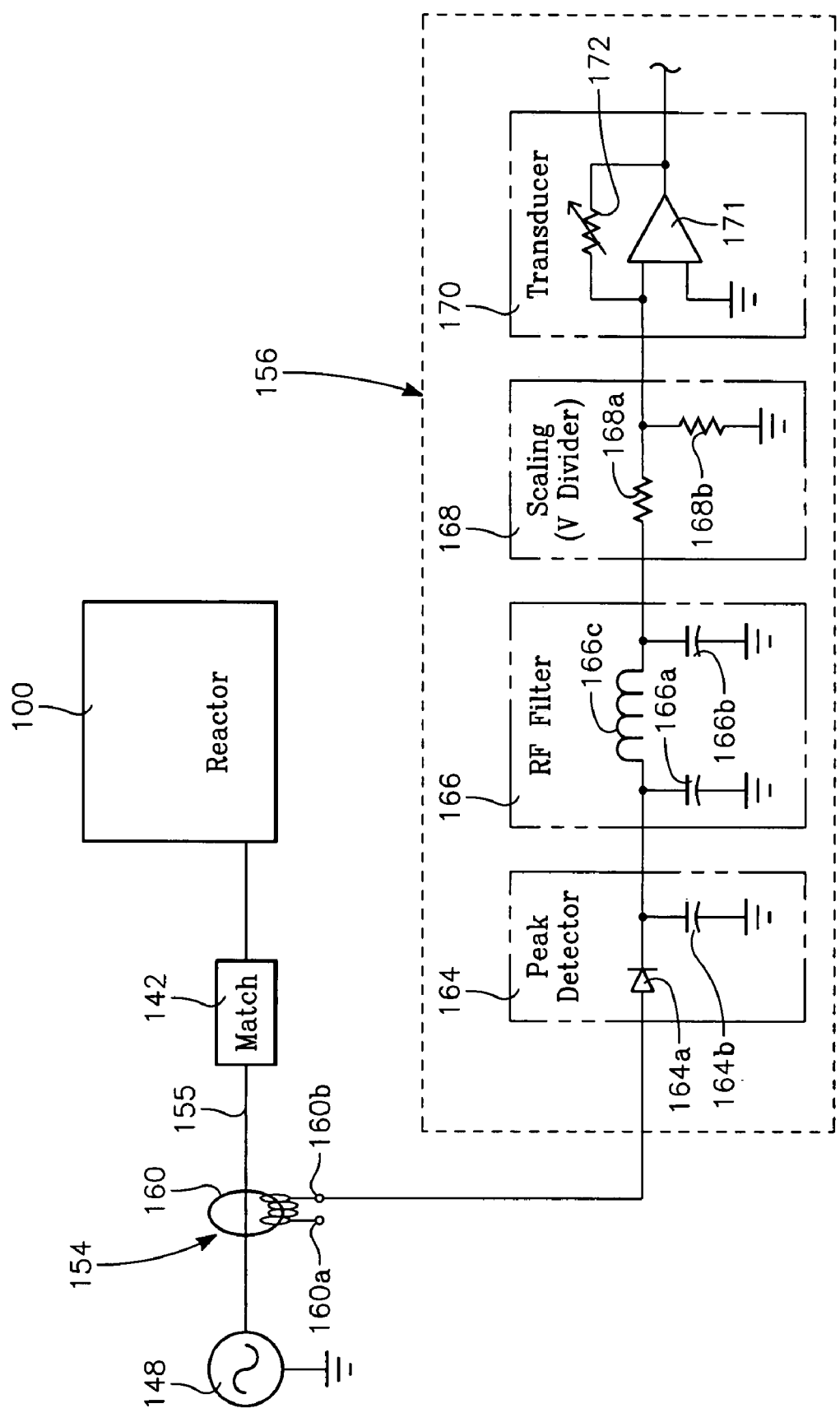
FIG. 2 is a schematic diagram depicting an RF current sensor circuit in the reactor of FIG. 1A.

Referring now to FIG. 2, the sensor 154 may be an RF current sensor. In this embodiment, the sensor 154 includes a ferrite ring 160 encircling the RF conductor 155 and a conductive (e.g., copper) coil 162 wrapped around a portion of the ferrite ring 160. One end 162a of the coil 162 may be allowed to float electrically, while the other end 162b is the output terminal of the sensor 154. One advantage of the structure of the ferrite ring 160 and coil 162 is that the current through the coil 162 is weakly coupled to the RF current through the RF power conductor 155. Therefore, the voltage induced on the coil 162 is attenuated and accordingly has a smaller dynamic range in response to transients or spikes in the current through the conductor 155. A related feature is that the weakly coupling limits the amount of power or current drawn by the sensor 154 from the RF power in the conductor 155. As a result, the sensor 154 places only a negligible load on the RF current in the conductor 155.

Figure 3:
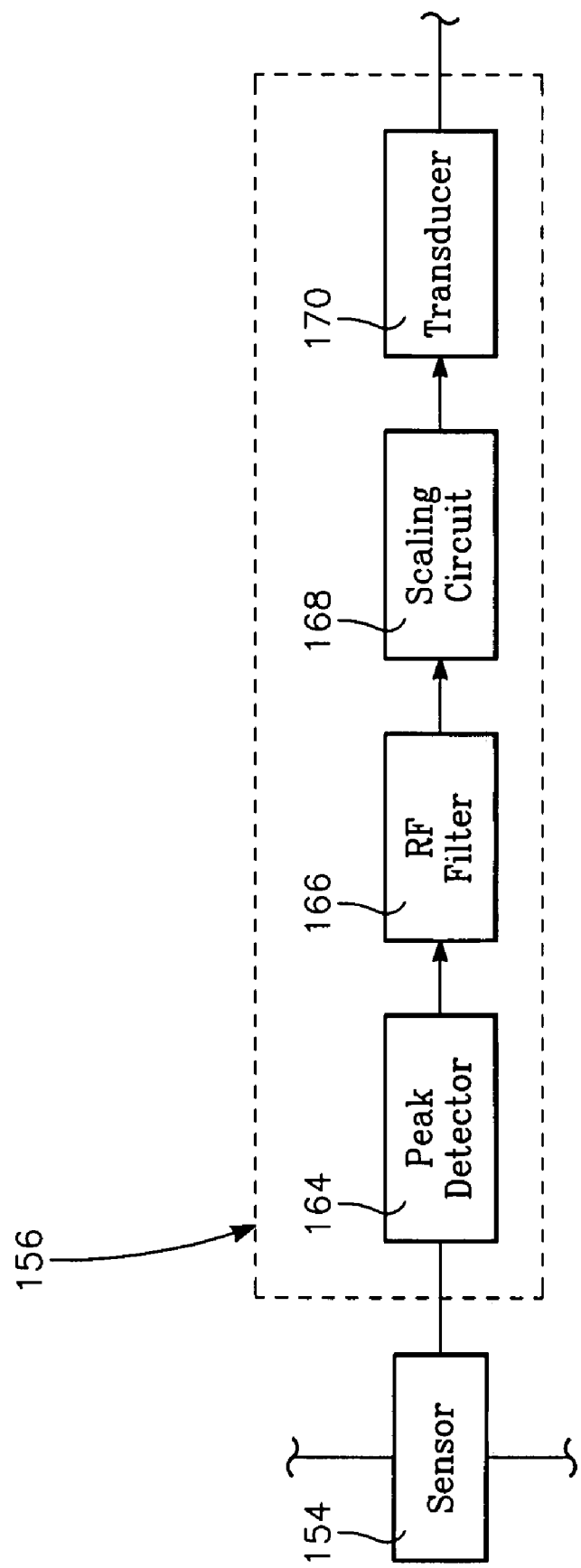
FIG. 3 is a block diagram of a signal conditioner in the reactor of FIG. 1A.

FIG. 3 depicts the different functions in the signal conditioner 156. The signal conditioner 156 includes a peak detector 164, an RF filter 166 for removing noise and providing a cleaner signal, a scaling circuit 168 for providing a predetermined range and a high impedance transducer 170 for controlling the signal amplitude range while providing a high impedance isolation between the output of the signal conditioner 156 and the sensor 154. One embodiment of the signal conditioner 156 is illustrated in FIG. 2. In the embodiment of FIG. 2, the peak detector 164 is depicted as including a diode rectifier 164a and a capacitor 164b. In other embodiments, the peak detector may include other circuit elements that provide an output level indicative of a true peak value. The RF filter 166 is depicted as a pi-network including a pair of shunt capacitors 166a, 166b and a series inductor 166c. The scaling circuit 168 is depicted in FIG. 2 as voltage divider consisting of a pair of resistors 168a, 168b, whose output voltage is scaled down by the ratio of the resistance of the resistor 168a to the total resistance of the resistors 168a and 168b. The transducer 170 is depicted in FIG. 2 as including an operational amplifier 171 that provides an output signal within a range (e.g., 0-10 V) determined by the amplifier gain. The gain may be controlled by a variable feedback resistor 172 connected between the amplifier input and output. The amplifier 171 provides a high input impedance that isolates the signal conditioner 156 from a load placed on the signal conditioner output.

Figure 4:
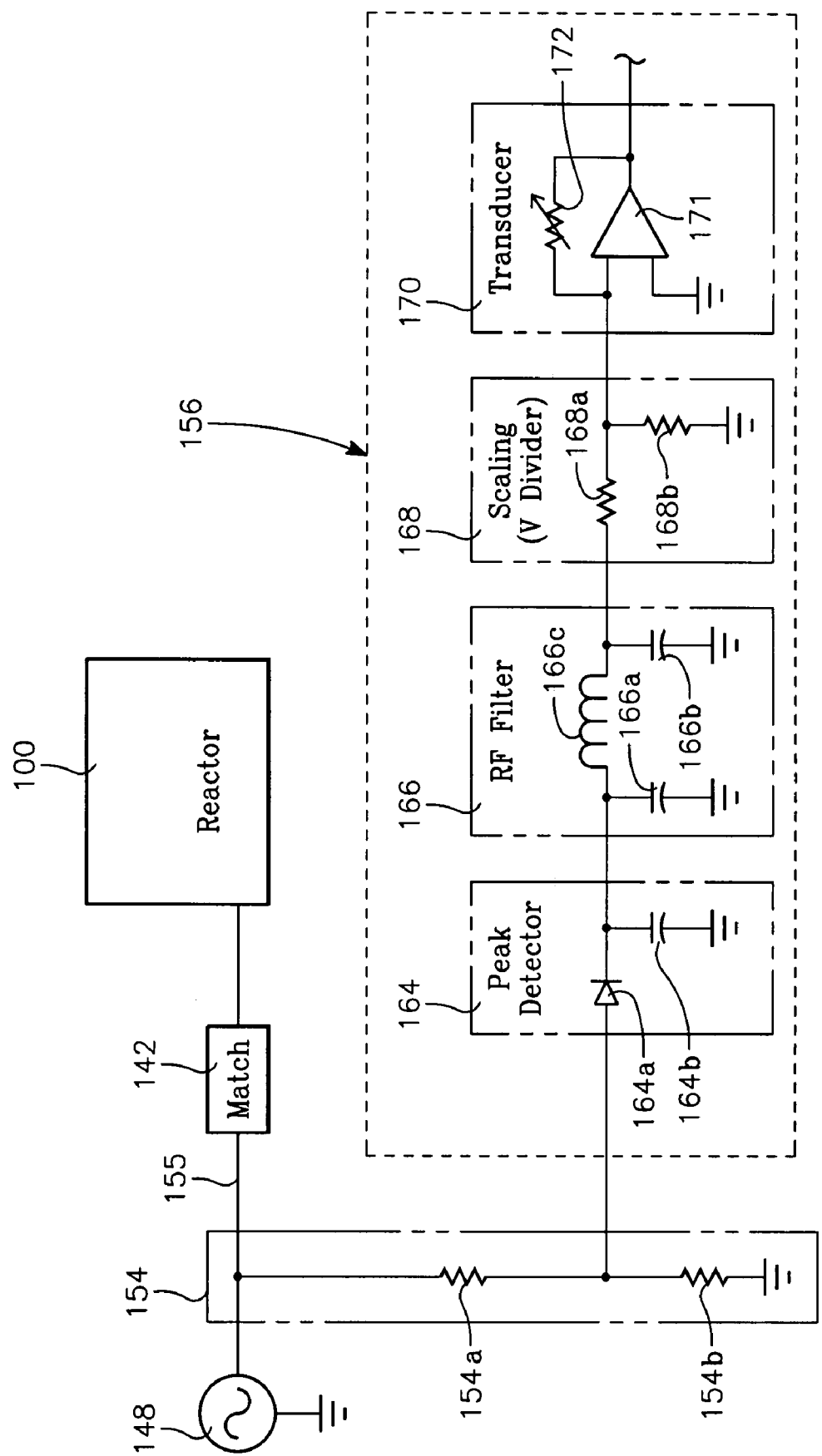
FIG. 4 is a schematic diagram depicting an RF voltage sensor circuit in the reactor of FIG. 1A.

FIG. 4 depicts an embodiment of the sensor 154 for sensing an RF voltage on the RF conductor 155. The sensor consists of a resistor divider 154a, 154b connected directly between the conductor 155 and ground, the series resistance of the resistor divider 154a, 154b being very high (on the order of megOhms). This prevents any significant power diversion to ground. The resistor 154a is 10-100 times less resistive than the resistor 154b, so that the voltage sensed by the peak detector 164 is very small compared to the voltage on the RF conductor 155. This provides the sensor 154 with a high input impedance to avoid drawing an appreciable current from the RF conductor 155. The signal conditioner 156 described above with reference to FIGS. 2 and 3 may also be employed to condition the output signal of the RF voltage sensor 154 of FIG. 4.

Figure 5A:
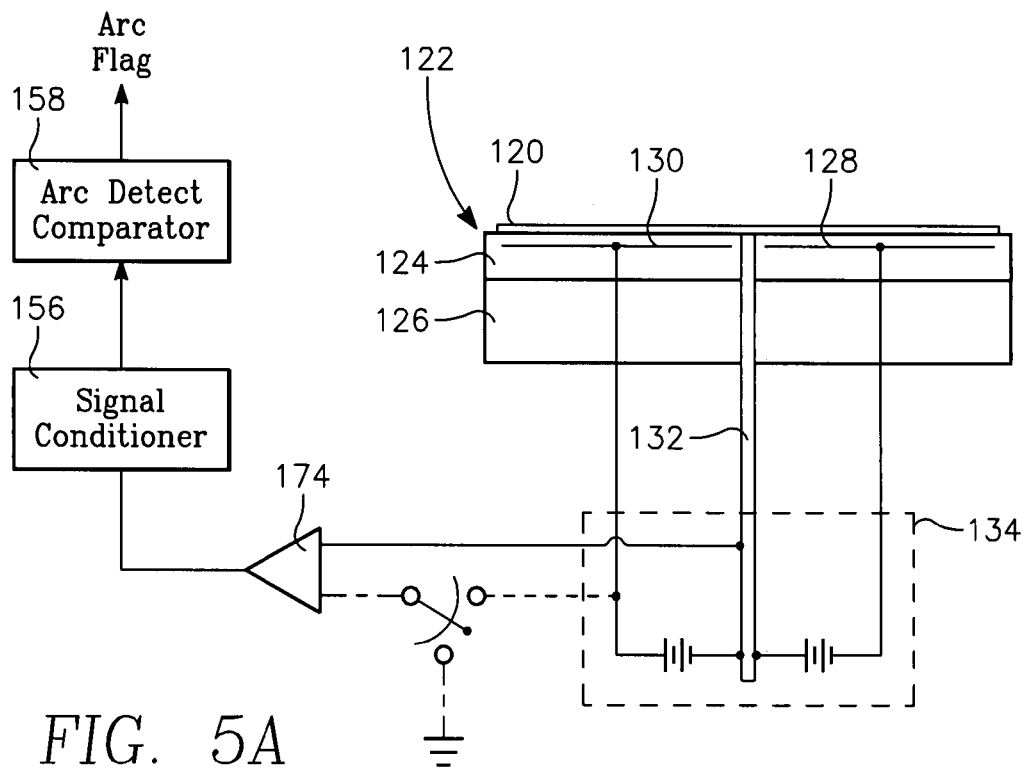
FIGS. 5A and 5B are schematic diagrams of modifications of the embodiments of FIGS. 1A and 1B, respectively, having a wafer level arc detecting circuit on an electrostatic chuck and employing a voltage sensor.

FIG. 5A depicts a modification of the embodiment of FIG. 1A in which arc detection is performed at the ESC electrodes 128, 130. The RF bias power generator 148 and RF bias impedance match 142 of FIG. 1A are not shown in the drawing of FIG. 5A, although they may be present if RF bias power is applied to the ESC electrodes 128, 130. Alternatively, no RF bias power is applied to the ESC electrodes 128, 130. The sensor 154 of FIG. 1A is replaced in FIG. 5A by a voltage sensor 174. The voltage sensor 174 is connected across the ESC center pin 132 (that is in contact with the semiconductor workpiece or wafer 120) and a reference point. The reference point may either be ground or one of the ESC electrodes 128 or 130. The voltage sensor 174 is a differential amplifier, with its differential inputs connected to the center pin 132 and the reference point (e.g., ground). Voltage transients on the wafer 120 appear as a large difference between the inputs of the differential amplifier 174. The output of the amplifier is proportional to this difference, and is furnished to the signal conditioner 156. The output of the signal conditioner is tested by the arc detect comparator 158 by comparison with a predetermined threshold, as in the embodiment of FIG. 1A.

Figure 5B:
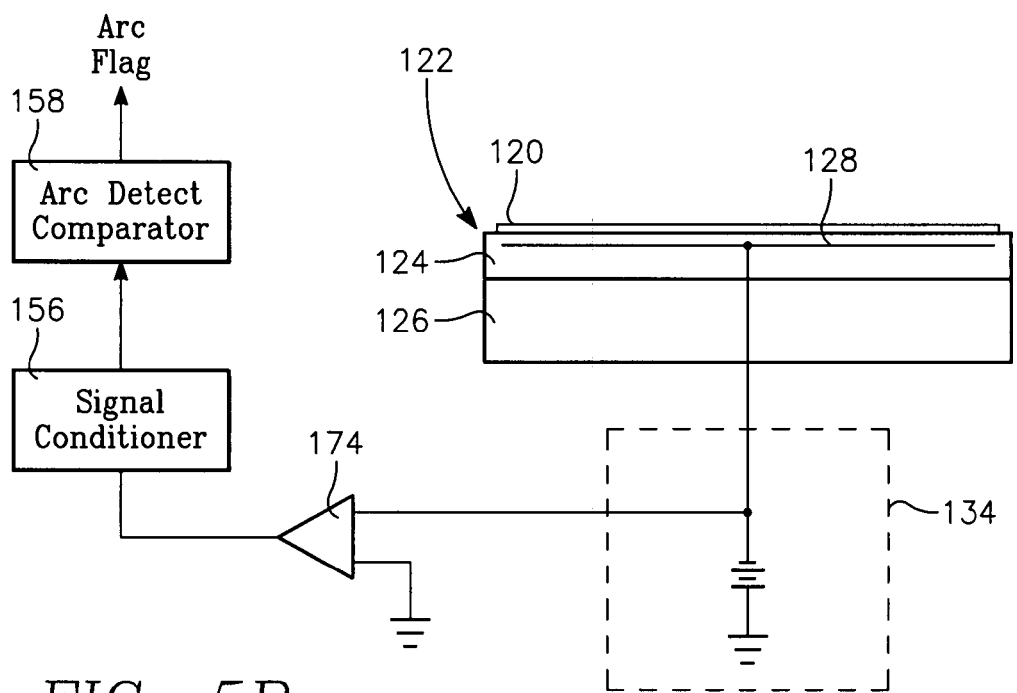

FIG. 5B depicts a similar modification to the embodiment of FIG. 1B, in which the sensor 154 of FIG. 1B is replaced in FIG. 5B by the differential amplifier 174. In the embodiment of FIG. 5B, the inputs to the differential amplifier 174 are connected to the single ESC electrode 128 and a suitable voltage reference such as ground. The RF bias power generator 148 and RF bias impedance match 142 of FIG. 1B are not shown in the drawing of FIG. 5B, although they may be present if RF bias power is applied to the ESC electrode 128. Alternatively, no RF bias power is applied to the ESC electrode 128. Voltage transients on the wafer 120 appear as a large difference between the inputs of the differential amplifier 174. The output of the amplifier is proportional to this difference, and is furnished to the signal conditioner 156. The output of the signal conditioner is tested by the arc detect comparator 158 by comparison with a predetermined threshold, as in the embodiment of FIG. 1A.

Figure 6A:
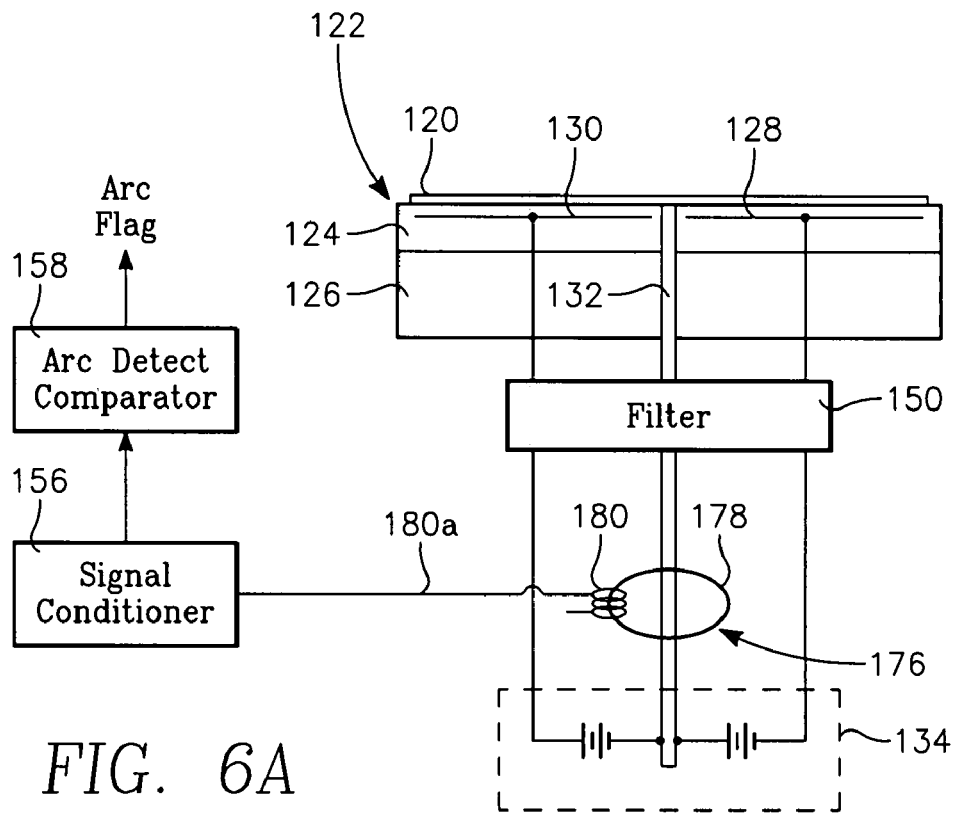
FIGS. 6A and 6B are schematic diagrams of modifications of the embodiments of FIGS. 1A and 1B, respectively, having a wafer level arc detecting circuit on an electrostatic chuck employing a current sensor.
Figure 6B:
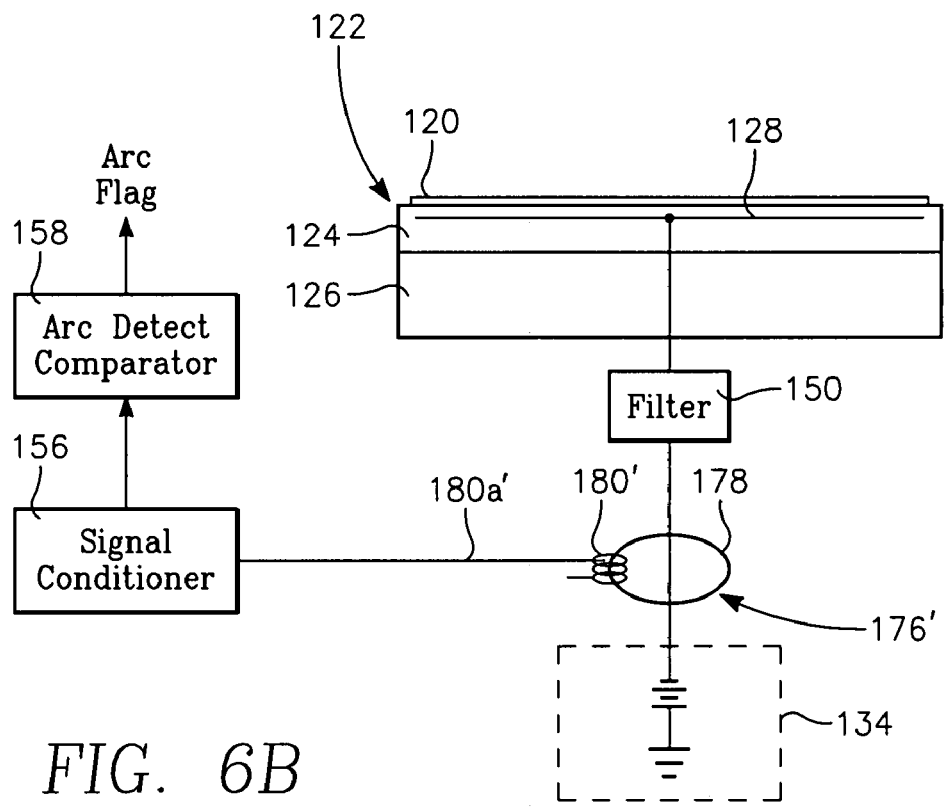

FIG. 6A illustrates a variation of the embodiment of FIG. 5A in which a current sensor 176 replaces the voltage sensor 174. The current sensor 176 includes a ferrite ring 178 around the center conductor 132 and a conductive winding 180 around the ring 178. One end 180*a* of the winding 180 is the output of the current sensor 176 and is connected to the input of the signal conditioner 156. FIG. 6B illustrates a similar variation of the embodiment of FIG. 5B in which a current sensor 176' replaces the voltage sensor 174. The current sensor 176' includes a ferrite ring 178' around the conductor connected to the single ESC electrode 128, and a conductive winding 180' around the ring 178. One end 180*a*' of the winding 180' is the output of the current sensor 176' and is connected to the input of the signal conditioner 156.

Referring again to FIG. 1A, a second RF sensor 184 is coupled to an RF power conductor 185 connected between the RF generator 140 and the RF impedance match 138 for the side wall coil 112. The second RF sensor 184 may be an RF current sensor, as in FIG. 2, or an RF voltage sensor, as in FIG. 4. The output of the second RF sensor 184 is applied to a second signal conditioner 186 that may be the same type of circuit as the signal conditioner 156 of FIGS. 2 and 3. A second arc detect comparator 188 compares the output of the signal conditioner with a certain threshold value to determine whether an arc has occurred. If an arc has occurred, the comparator 188 generates an arc flag that is sent to the controller 152. A third sensor 190 is coupled to the output of the D.C. power generator 136. The output of the third sensor 190 may be applied to a third signal conditioner 192. A third arc detect comparator 194 compares the output of the signal conditioner 192 with a certain threshold to determine whether an arc has occurred. Its output, an arc flag, is transmitted to the process controller 152.

The controller 152 may include a memory 152*a* for storing a sequence of instructions and a microprocessor 152*b* for executing those instructions. The instructions represent a program that may be downloaded into the controller memory 152*a* for operating the reactor. In accordance with one feature, the program requires the controller 152 to shut off the power generators 136, 140, 148 in response to receipt of an arc flag from any of the arc detect comparators 158, 188 or 194. This program will be discussed in greater detail in a later portion of this specification.

Figure 7B:
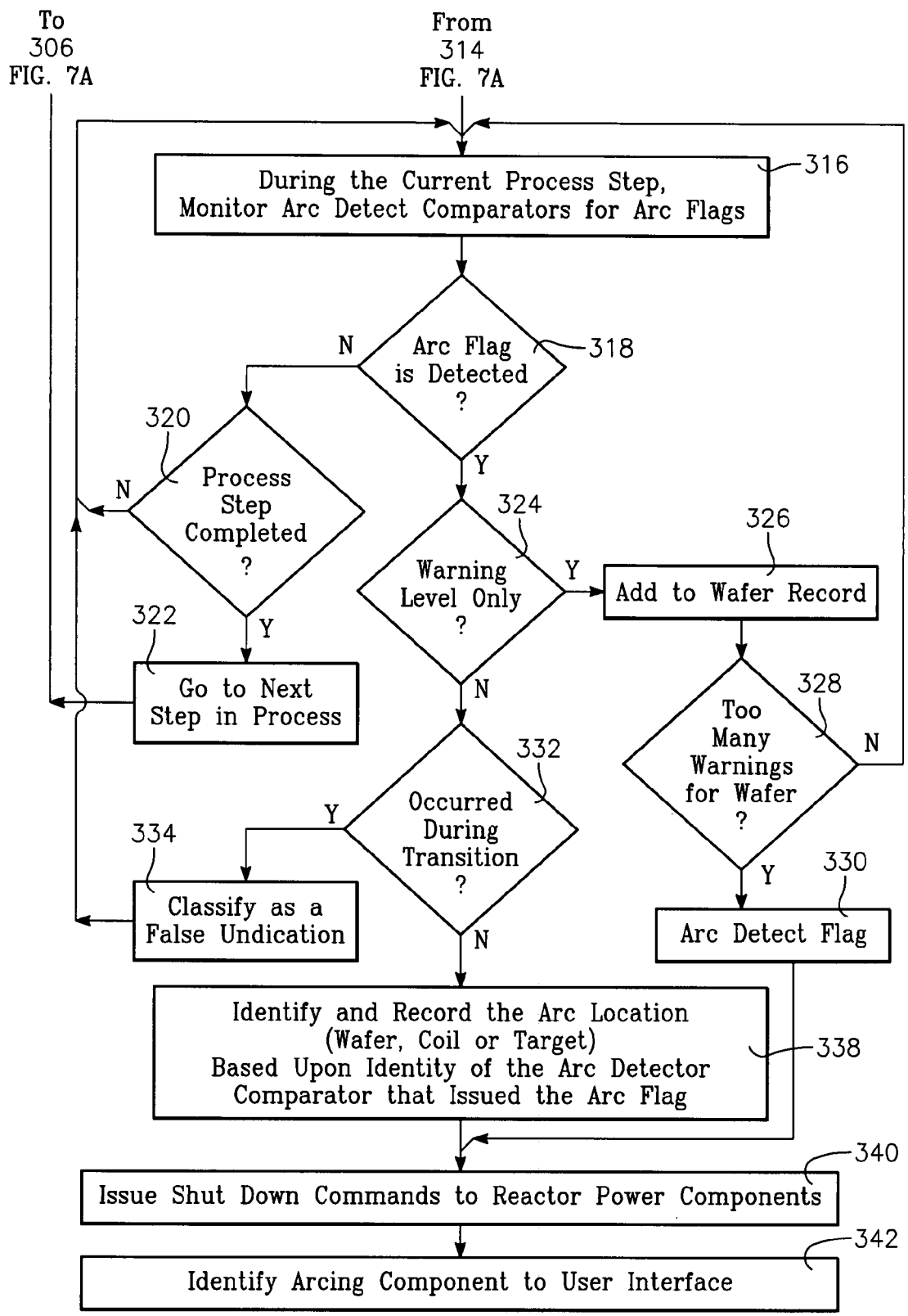

Operation of the Process Controller:

Operation of the process controller 152 of FIG. 1A is depicted in the flow diagram of FIGS. 7A AND 7B. The process recipe may be downloaded into the controller memory 152*a* (block 300 of FIGS. 7A AND 7B). The reactor component history (e.g., the number of use hours for each consumable in the reactor) may also be loaded into the controller memory 152*a* (block 302). The controller then starts the process in the reactor (block 304). For the current process step, the controller 152 notes the RF power settings called for by the recipe (i.e., the RF power applied to the ESC 122 and the RF power applied to the coil 112. From these power settings, the controller 152 predicts an RF noise level encountered by each of the sensors 154, 184 and 190. For each sensor, the controller 152 determines from the noise level an appropriate arc detection comparison threshold for each of the comparators 158, 188 and 194 (block 306 of FIGS. 7A AND 7B). For the particular sensor, a sensed voltage (or current) level exceeding the assigned threshold is considered to be an arc event. Optionally, the controller 152 may also define a warning level threshold that is below the arc detection threshold.

After the comparison threshold has been defined for each of the sensors 154, 184, 190, each threshold is revised in accordance with the age of the associated reactor consumable components (block 308). This may be done in accordance with historical data representing typical lifetimes of each consumable component in the reactor. For example, the sensor 154 detects arc events closest to the wafer 120. These are most likely affected by the condition of consumable components closest to the wafer, such as a process ring kit surrounding the ESC (not shown in FIG. 1A), for example. Accordingly, the arc detect comparison threshold for the sensor 154 are revised depending upon the age of the process ring kit. Likewise, the sensor 184 detects arc events at the side wall coil 112. Therefore, the thresholds chosen for the sensor 184 are revised based upon the age of the coil 112, for example. Typically, this revision causes the threshold to increase with consumable age or hour usage, because as the consumable wears and its surface becomes rougher during exposure to plasma, it tends to experience or promote more RF noise and harmonics. This revision of the arc detection threshold based upon age may be performed based upon empirical data representing the histories of a large sample of the consumable component.

In one embodiment, the next step is to determine whether the upwardly adjusted threshold is at or too near the expected voltage or current level of a real arc event (block 310). If so (YES branch of block 310), this fact is flagged (block 311) to the user and/or to the process controller 152. In one embodiment, this flag may cause the process controller 152 to shut down the reactor. The location of the sensor whose threshold has become excessive in this way is identified, and the reactor consumables closest to that detector are identified to the user as being due for replacement.

Provided the adjusted thresholds are not excessive (NO branch of block 310), they are then sent to the arc detection comparators 158, 188 and 194 for use during the current process step (block 312). From the process recipe, the controller 152 can identify the specific times of occurrence of process-mandated transients (block 314), such as the activation or deactivation of an RF power generator. During the performance of the current process step, the controller 152 monitors each of the arc detection comparators 158, 188 and 194 for arc flags (block 316). Each of the comparators 158, 188, 194 constantly compares the output of the respective signal conditioner 156, 186, 192 with the threshold received from the controller 152 for the current process step. Whenever the signal conditioner output exceeds the applicable threshold, the comparator transmits an arc flag to the controller 152. The controller 152 may sample the comparator outputs at a rate of 30 MHz, for example. For each sample of each comparator 158, 188, 194, a determination is made whether an arc flag has issued (block 318). If no flag is detected (NO branch of block 318), then the controller 152 determines whether the current process step has been completed (block 320). If not (NO branch of block 320), the controller 152 returns to the monitoring step of block 316. Otherwise (YES branch of block 320) the controller 152 transitions to the next process step in the recipe (block 322) and loops back to the step of block 306.

If an arc flag is detected (YES branch of block 318), then it is determined whether the sensed voltage or current transient merely exceeded the warning threshold or whether it exceeded the arc threshold level (block 324). This is determined from the contents of the flag issued by the particular comparator. If it was a warning level only (YES branch of block 324), then the controller 152 records the event and associates the event with the current wafer (block 326). The controller 152 then determines whether the number of warnings for the current wafer is excessive (block 328). If the number of warnings for that wafer exceeds a predetermined number (YES branch of block 328), a flag is issued (block 330) and the controller 152 may shut down the reactor. Otherwise (NO branch of block 328), the controller returns to the step of block 316.

If the arc flag was for a full arc event in which the arc threshold was exceeded (NO branch of block 324), then a determination is made (block 332) as to whether it coincided with a power transition time identified in the step of block 314. If so (YES branch of block 332), the flag is ignored as a false indication (block 334) and the controller loops back to the monitoring step of block 316. Otherwise (NO branch of block 332), the arc flag is treated as valid. The controller 152 uses the contents of the arc flag to identify and record in memory the location of the sensor that sensed the arc event (block 338). The controller issues "OFF" commands to each of the power generators 136, 140 and 148 (block 340). The arc flag may embody digital information identifying the particular comparator that issued the arc flag. This information is output by the controller 152 to a user interface, which can correlate sensor location with consumable components (block 342). This feature can enable the user to better identify consumable components in the reactor chamber that need to be changed. For example, if the controller 152 determines that the arc flag was issued by the comparator 188, then it identifies the consumable component closest to the RF power monitored by the comparator, namely the side wall coil 112. For an arc flag issued by the comparator 158, the closest consumable components are those surrounding the wafer, particularly the process ring kit, and the controller 152 would associate such an arc flag with the process ring kit, for example. For an arc flag issued from the comparator 194, the relevant component is the ceiling target, and the controller would associate such an arc flag with the ceiling target. Thus, the controller 152 in one embodiment can provide the user different lists of possible candidate consumables for replacement for different arc flag events.

The process depicted in FIGS. 7A AND 7B includes, in one embodiment, dynamic adjustment of the arc detection comparison threshold for each step in the plasma process. The threshold is further adjusted based upon consumable component age. The controller 152 updates the thresholds in each of the comparators 158, 188, 194 as often as necessary. By such dynamic adjustment of the comparison thresholds, the sensitivity of each comparator 158, 188, 194 is optimized by seeking the minimum threshold that can be used in the environment of a particular wafer process step. The threshold is adjusted downwardly whenever noise conditions (for example) improve, and is adjusted upwardly when noise level increases, due to an increase in RF power level, for example. Such a threshold increase avoids false arc indications that can arise when the noise level approaches the arc detection threshold level. In an embodiment, the process of FIGS. 7A AND 7B further includes performing arc location identification and corresponding identification of the likeliest consumable components involved in the arc event. The controller 152 communicates this information to the user, to facilitate easier management of consumables and more accurate selection of consumables needing replacement.

In one embodiment, the process of FIGS. 7A AND 7B is embodied in software instructions downloaded into the controller memory 152a. In this embodiment, therefore, all the intelligent actions are performed by the controller 152, while the arc detection comparators simply perform a comparison function. However, in another embodiment, the arc detection comparators 158, 188, 194 may include their own internal processors and memories, enabling them to perform some of the functions in the process of FIGS. 7A AND 7B.

Retrofit Control and Communication:

The process of FIGS. 7A AND 7B involves frequent two-way communication between the controller 152 and each of the arc detection comparators 158, 188, 194. The controller 152 periodically transmits updated comparison threshold values to particular ones of the comparators 158, 188, 194, different values being downloaded to different comparators. The comparators 158, 188, 194 transmit arc flags whenever an arc is detected. The arc flag includes the identity of the individual comparator that issued it. The controller further transmits shutdown (ON/OFF) commands to the power generators 136, 140 and 148 in response to a valid arc flag from any of the arc detection comparators 158, 188, 194. It is intended that the arc detection features of FIG. 1A (as implemented in the process of FIGS. 7A and 7B) be installed on plasma reactors already operating in the field. For reactors already installed in the field, installation onto each reactor of a custom communication network to meet each of the foregoing communication needs would be prohibitively costly. To reduce costs, communication systems already existing on such reactors are exploited. In some cases, the existing communication systems are able to meet and facilitate all of the communication needs of the arc detection features of FIGS. 1 and 7.

Figure 8:
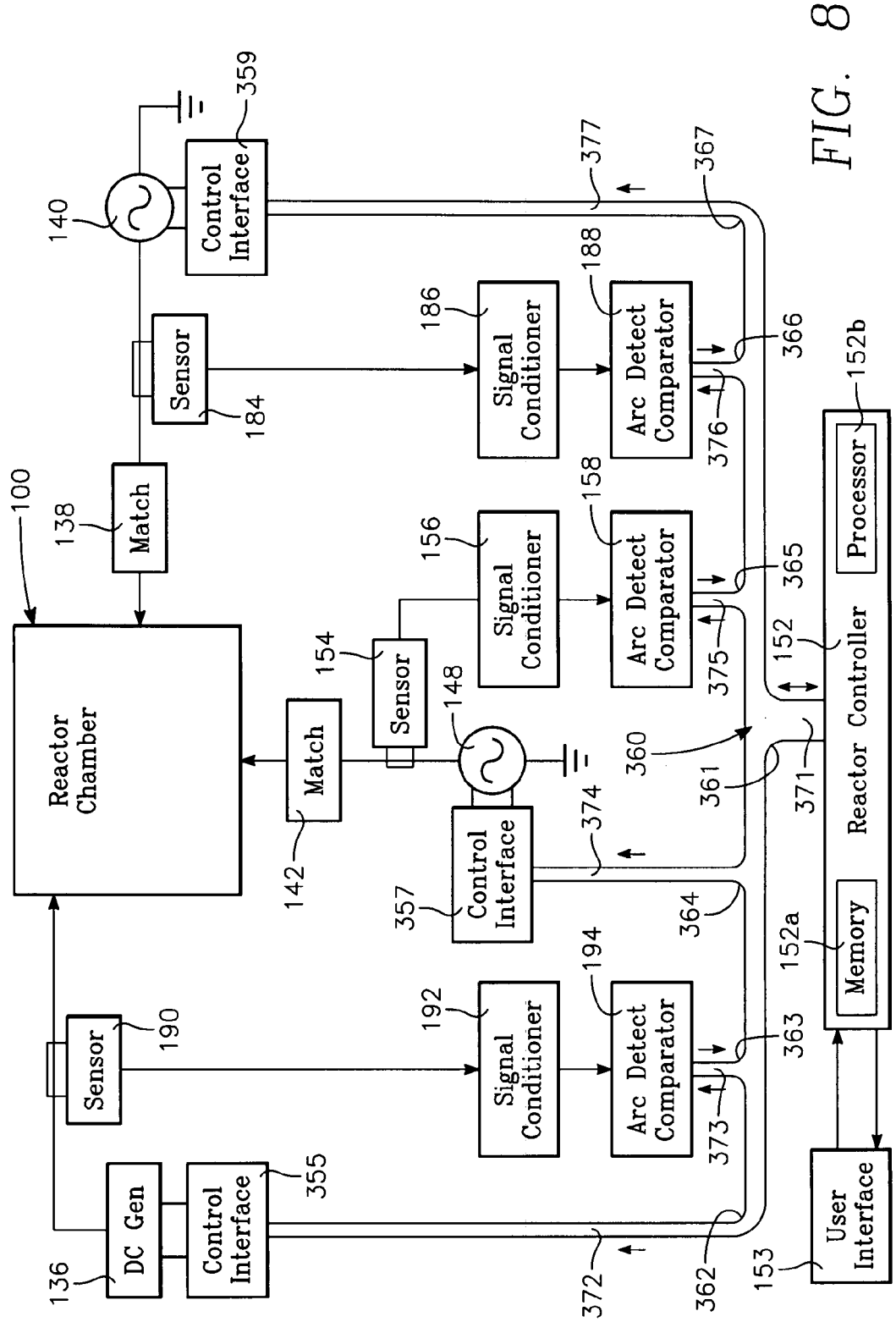
FIG. 8 depicts a retrofitting of the arc sensing and communication features of FIG. 1A into a reactor having a local area network.

In some reactors, a local area network (LAN) is provided in which the controller communicates via the LAN with every active device and sensor on the reactor. FIG. 8 illustrates the structure of such a LAN in a reactor of the type depicted in FIG. 1A. For each active device to be governed by the controller 152, an interface device is coupled to it. The interface device converts received digital commands to actions that shut down the active device. For example, in FIG. 8, interface devices 355, 357, 359 are connected to respective power generators 136, 140, 148. The interface devices are capable of shutting down the generators in response to received digital commands. A local area network (LAN) 360 is provided. The LAN is a multiple conductor communication channel or cable having multiple I/O ports 361, 362, 363, 364, 365, 366, 367, which may be implemented as multiconductor connectors. Each device that is to communicate on the LAN 360 has a memory and limited processing capability that permits it to store and issue a unique address on the LAN 360. Thus, each control interface 355, 357, 359 and each comparator 158, 188, 194 has conventional process circuitry that responds to LAN protocols and stores its own device address. Each device 158, 188, 194, 355, 357, 359 on the LAN responds only to received communications that are addressed to its device address. Furthermore, each device attaches its device address to its data transmissions on the LAN. Each of the devices 158, 188, 194, 355, 357, 359 is coupled to the LAN 360 at a unique one of the ports 361, 362, 363, 364, 365, 366, 367 via its own multiconductor cable 371, 372, 373, 374, 375, 376, 377, respectively. On reactors already installed in the field having such a LAN, there may be no comparators 158, 188, 194. Therefore, the arc detection system communication features of FIG. 1A are realized in such a reactor by identifying spare (unused) ports on the existing LAN 360 (e.g., the ports 363, 365 and 366) and connecting the comparators 158, 188, 194 to them in the manner depicted in FIG. 8.

The device addresses of all the devices on the LAN 360 (i.e., the comparators 158, 188, 194 and the control interfaces 355, 357, 359) may be intelligently assigned by the controller 152 upon activation of the LAN 360, using conventional techniques. In the system of FIG. 8, the controller 152 carries out the process of FIGS. 7A AND 7B by sending an individual communication addressed to an individual comparator with instructions to download a certain threshold value, for example. Each comparator responds to an arc event by transmitting a communication addressed to the controller 152 and containing the comparator's device address and a message signifying occurrence of an arc event. The controller 152 can respond to a valid arc event by transmitting a communication addressed to each of the power generator control interfaces 355, 357, 359 containing a command to shut down the corresponding generator. The location of the sensor that caused the arc flag to be issued is deduced by the controller 152 from the device address of the corresponding arc detect comparator. The controller 152 can provide this information to the user at a user interface 153 of the controller 152.

Figure 9:
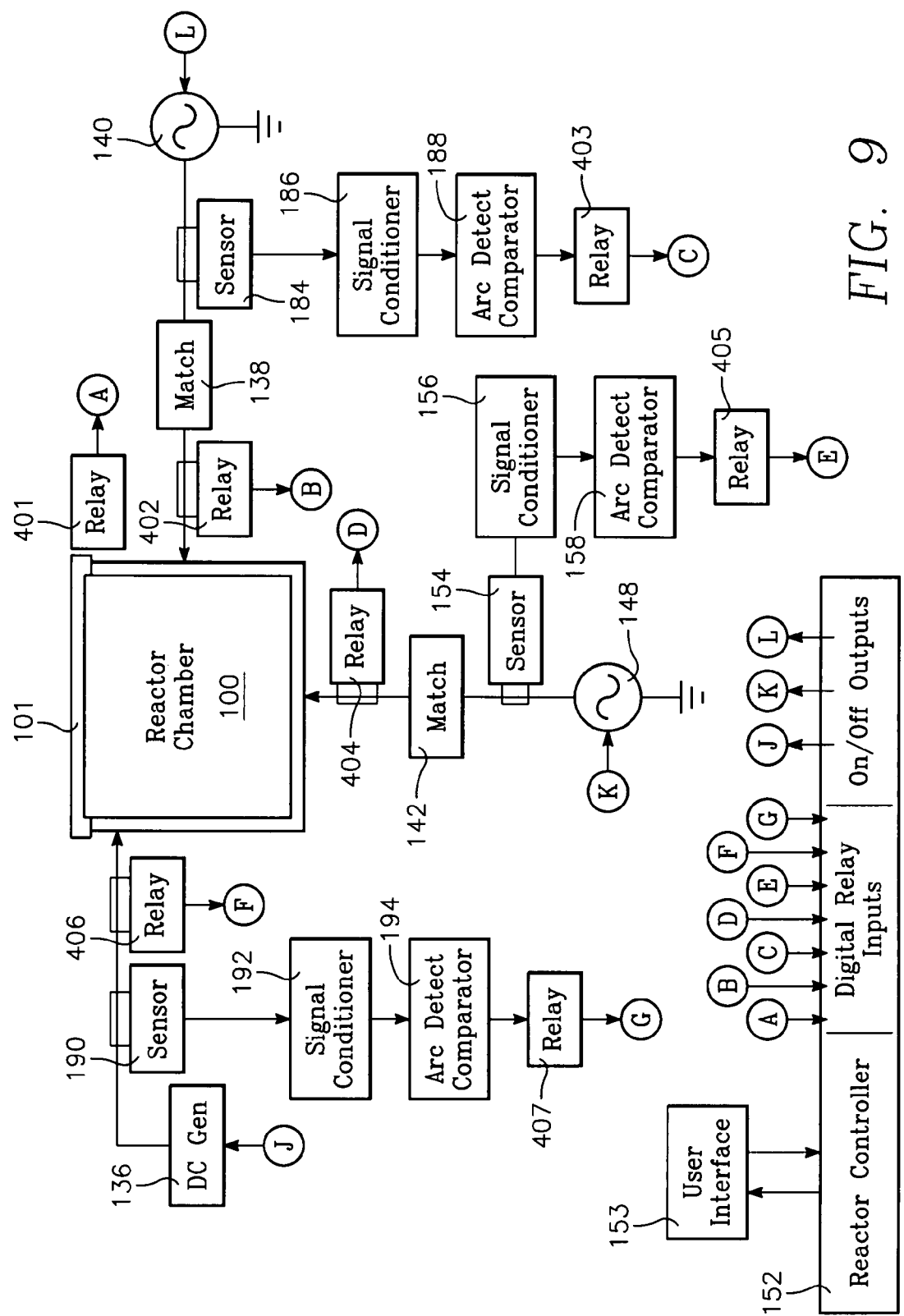
FIG. 9 depicts a retrofitting of the arc sensing and communication features of FIG. 1A into a reactor having a digital input/output network.

In other reactors, no LAN is provided or available, and instead a custom communication digital input/output (DI/O) network is provided as depicted in FIG. 9. In the DI/O network of FIG. 9, each device communicates with the controller 152 (and vice versa) over a communication channel dedicated to that device. The DI/O network on pre-existing reactors employs respective DI/O relays 401, 402, 404, 406 that individually communicate with the controller 152, and monitor individual safety points. Specifically, for example, the DI/O relay 401 signals whenever a lid 101 of the chamber 100 is opened, the DI/O relay 402 signals whenever the RF power cable to the side wall coil is disconnected, the DI/O relay 404 signals whenever the RF bias power cable is disconnected and the DI/O relay 406 signals whenever the D.C. power cable to the ceiling target is disconnected. The controller 152 receives the signals from these relays at inputs A, B, D, and F, as indicated in the drawing of FIG. 9. The controller 152 transmits shutdown (ON/OFF) commands to each of the power generators 136, 148 and 140 via dedicated communication channels J, K and L, as indicated in FIG. 9.

The communication features of FIG. 1A may be implemented in the DI/O network of FIG. 9 provided there are three DI/O relays that can be spared for use with the arc detect comparators 158, 188 and 194. As shown in the example of FIG. 9, pre-existing DI/O relays 403, 405 and 407 are appropriated for connection to the outputs of the arc detect comparators 188, 158 and 194, respectively. Each time one of the arc detect comparators 158, 188 or 194 issues an arc flag, the DI/O relay attached to it signals the controller 152. The controller 152 deduces the identity of the arc detect comparator that issued the arc flag from the location of the wire or channel carrying the signal. This information may be furnished to the controller's user interface 153 for use in managing consumable replacement.

Figure 10:
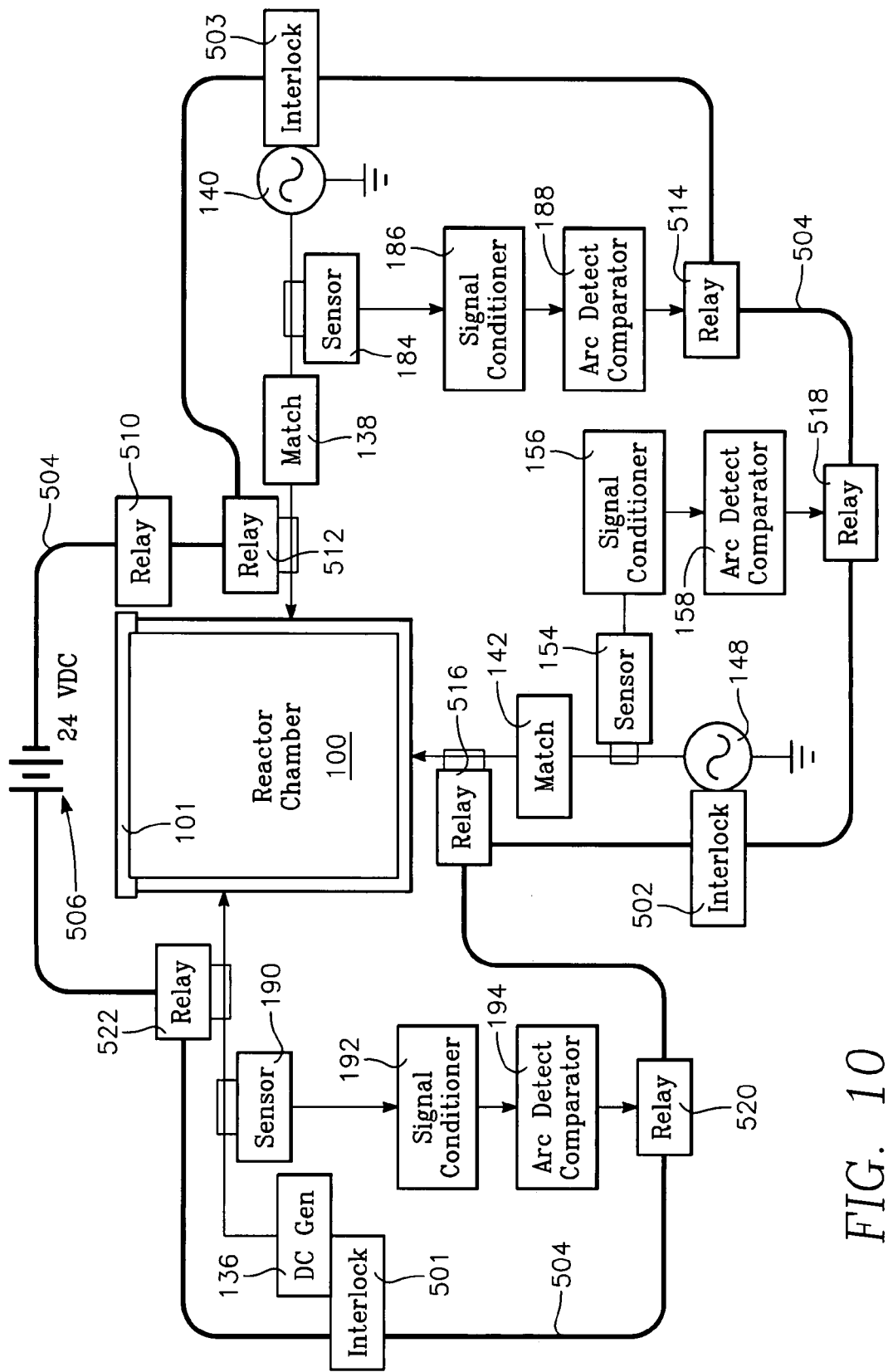
FIG. 10 depicts a retrofitting of the arc sensing and communication features of FIG. 1A into a reactor having a D.C. safety interlock loop.

Earlier model reactors currently installed in the field may have neither a LAN nor a DI/O network. In such reactors, the arc detection system of FIG. 1A may be implemented in a basic form by exploiting a 24 volt safety interrupt circuit provided on such reactors. This circuit ensures immediate shut down of the power generators whenever the chamber lid is opened or whenever a power cable connection to the chamber is interrupted. Referring to FIG. 10, the power generator 136 has an interlock 501, the power generator 148 has an interlock 502 and the power generator 140 has an interlock 503. Each generator 136, 148 and 140 can operate only if its interlock constantly senses a 24 Volt DC potential on a circuit conductor 504. The circuit conductor 504 connects all of the interlocks 501, 502, 503 in series with a 24 VDC supply 506. The series circuit conductor 504 is interrupted by several simple switch relays 510, 512, 514, 516, 518, 520 and 522. Therefore, each relay by itself can sever the series connection of the 24 volt supply 506 to the generator interlocks 501, 502, 503, thereby shutting down the reactor. The relay 510 opens its connection whenever the chamber lid 101 is opened. The relay 512 opens its connection whenever the RF power cable connection to the side wall coil 112 is interrupted. The relay 516 opens its connection whenever the RF power cable to the ESC 122 is interrupted. The relay 522 opens its connection whenever the RF power cable connection to the ceiling target is interrupted. The chamber 100 may be automatically shut down in response to arc detection by any of the three arc detect comparators 158, 188 and 194 provided there are three spare relays connected in series along the circuit conductor 504 and available to accept the outputs of respective ones of the comparators 158, 188 and 194. FIG. 10 shows that three such relays, namely the relays 514, 518 and 520, may be connected to the outputs of the comparators 188, 158 and 194, respectively. Whenever any one of the comparators 188, 158, 194 senses a voltage (or current) exceeding its predetermined threshold, it issues an arc flag in the form of a voltage that causes the corresponding relay (514, 518 or 520, respectively) to open its connection. This interrupts the 24 volt circuit of the conductor 504, causing each of the interlocks 501, 502, 503 to disable the associated power generator (136, 148 and 140, respectively).

While the embodiment of the RF impedance match 138 illustrated in FIG. 1A has a single RF input and an RF output, in another embodiment the RF impedance match 138 may have, in addition, a low power D.C. input (not shown in the drawings). In such a case, an additional arc sensor and threshold comparator of the type described above may be coupled to the unillustrated low power D.C. input of the RF impedance match 138.

While the reactor of FIG. 1A or 1B has been described as detecting an arc based upon the output of a single one of the various sensors 154, 184, 190, etc., the decision may instead be based upon the outputs of several (or possibly all) of the sensors. For example the controller 152 of the embodiment of FIG. 1, 8 or 9 has been described as responding to an arc event based upon the output of any single one of the sensors 154, 184 or 190 through the corresponding comparator 158, 186 or 194, respectively. However, in one embodiment, the controller 152 of FIG. 1, 8 or 9 is programmed to combine the outputs of at least two (or more) of the threshold comparators 158, 186, and make a decision based upon the combined signals. The output signals may be combined by the processor 152 through a linear, polynomial, or more complex mathematical function. In this case, the controller 152 would be programmed to respond to the combined signal to determine whether an arc was detected or to determine whether to shut down the reactor. In yet another embodiment, the individual outputs of the sensors 154, 184, 190 may be combined before being processed by a threshold comparator. The individual output signals from at least two of the sensors 154, 184, 190 may be combined through a linear, polynomial, or more complex mathematical function. The resulting combined signal is then fed to a single comparator (e.g., the comparator 186), and the output of that single comparator is fed to the controller 152.

While the foregoing is directed to embodiments of the invention, other and further embodiments of the invention may be devised without departing from the basic scope thereof, and the scope thereof is determined by the claims that follow.

What is claimed is:

1. A plasma reactor system, comprising:
   a reactor chamber and a support pedestal in the chamber for holding a workpiece; plural power applicators; plural power generators, at least respective ones of said plural power generators coupled to at least respective ones of said plural power applicators;
   plural voltage or current sensors, at least respective ones of said plural voltage or current sensors coupled to said at least respective ones of said power applicators and to said support pedestal;
   plural comparators, at least respective ones of said plural comparators coupled to the at least respective ones of said voltage or current sensors, said at least respective ones of said comparators associated with respective comparison thresholds;
   a programmable controller programmed to carry out the steps of:
   (a) storing a process recipe comprising plural steps;
   (b) updating the respective thresholds of the at least respective ones of said comparators with respective updated thresholds for different ones of the steps of said process recipe; and
   (c) responding to an arc detection flag from one of said comparators by deactivating said at least respective ones of said plural power generators;
   communication channel apparatus coupled between said programmable controller and each of said at least respective ones of said comparators, wherein said controller is programmed to (a) update the respective thresholds by transmitting said updated thresholds to the at least respective ones of said comparators through said communication channel apparatus and (b) receive arc detection flags from said at least respective ones of said comparators through said communication channel apparatus;
   respective on/off control interfaces coupled to said at least respective ones of said plural power generators, said communication channel apparatus being further coupled between said programmable controller and said respective on/off control interfaces; and
   wherein each of said comparators is responsive to a unique device address, and wherein said controller is programmed to send a respective updated threshold to the corresponding comparator by transmitting the device address of the corresponding comparator with the updated threshold on said communication channel apparatus.

2. The system of claim 1 wherein each of said on/off control interfaces is associated with a device address and wherein said programmable controller is further programmed to deactivate said power generators by transmitting deactivation commands on said communication channel apparatus with respective device addresses of said control interfaces.

3. The system of claim 2 further comprising a user interface coupled to said programmable controller, said programmable controller being further programmed to infer locations of arc flags from device addresses accompanying arc flags received on said communication channel apparatus, and to convey said locations to said user interface.

4. The system of claim 2 wherein said communication channel apparatus comprises a local area network.

5. The system of claim 1 wherein said support pedestal comprises an electrostatic chuck having at least one of a chucking electrode or a contact rod for contacting the backside of the workpiece, and wherein said sensor coupled to said workpiece support comprises a voltage sensor coupled to sense a voltage or current transient on one of said contact rod or said chucking electrode.

6. The system of claim 1 wherein said support pedestal comprises an electrostatic chuck having at least a chucking electrode, said system further comprising a power generator and an impedance match coupled between said power generator and said chucking electrode by a power conductor, said sensor coupled to said workpiece support comprising a voltage or current sensor coupled to said power conductor.

7. The system of claim 6 wherein said voltage or current sensor coupled to said power conductor comprises a conductive ring around said power conductor and a coil wound around said ring, one end of said coil being coupled to the corresponding comparator.

8. The system of claim 1, further comprising:
   respective sensor relays, some of said relays being coupled to outputs of said at least respective ones of said comparators;
   wherein said communication channel apparatus comprises:
   (a) respective channels dedicated to communication of arc flags from respective ones of said sensor relays to said controller; and
   (b) respective channels dedicated to communication of shutdown commands from said controller to said at least respective ones of said power generators of said reactor.

9. The system of claim 1, wherein said communication channel apparatus further comprises:
   respective channels dedicated to communication of updated thresholds from said processor to respective ones of said comparators.

10. A plasma reactor system, comprising:

a reactor chamber and a support pedestal in the chamber for holding a workpiece; plural power applicators; plural power generators, at least respective ones of said plural power generators coupled to at least respective ones of said plural power applicators;

plural voltage or current sensors, at least respective ones of said plural voltage or current sensors coupled to said at least respective ones of said power applicators and to said support pedestal;

plural comparators, at least respective ones of said plural comparators coupled to the at least respective ones of said sensors, said at least respective ones of said comparators associated with respective comparison thresholds;

on/off control apparatus connected between said respective comparators and said power generators;

a programmable controller programmed to update the respective thresholds of the at least respective ones of said comparators with respective updated thresholds for different steps of a process recipe;

communication channel apparatus coupled between said programmable controller and each of said at least respective ones of said comparators;

wherein each of said at least respective ones of said comparators is responsive to a unique device address, and wherein said controller is programmed to send a respective updated threshold to the corresponding comparator by transmitting the device address of the corresponding comparator with the updated threshold on said communication channel apparatus.

11. The system of claim 10 wherein said on/off control apparatus comprises:

an interlock electrical series circuit comprising:
(a) relays coupled to sense interruption of respective safety connections; and
(b) power generator interlocks for disabling respective ones of said power generators upon interruption of said interlock series circuit; and said at least respective ones of said comparators being coupled to respective ones of said relays.

12. The system of claim 10 wherein said support pedestal comprises an electrostatic chuck having at least one of a chucking electrode or a contact rod for contacting the backside of the workpiece, and wherein said sensor coupled to said workpiece support comprises a voltage sensor coupled to sense a voltage or current transient on one of said contact rod or said chucking electrode.

13. The system of claim 10 wherein said support pedestal comprises an electrostatic chuck having at least a chucking electrode, said system further comprising a power generator and an impedance match and a power conductor coupled between said power generator and said chucking electrode, said sensor coupled to said workpiece support comprising a voltage or current sensor coupled to said power conductor.

14. The system of claim 13 wherein said voltage or current sensors coupled to said power conductor comprises a conductive ring around said power conductor and a coil wound around said ring, one end of said coil being coupled to the corresponding comparator.

\* \* \* \* \*